United States Patent

[11] 3,577,090

[72] Inventor William C. Montgomery, Jr.
Houston, Tex.

[21] Appl. No. 852,840
[22] Filed Aug. 25, 1969
[45] Patented May 4, 1971
[73] Assignee Shell Oil Company
New York, N.Y.

[54] FAST SETTLING, STABLE AMPLIFIER CIRCUIT
5 Claims, 2 Drawing Figs.

[52] U.S. Cl. ........................................................ 330/69, 330/110, 330/151
[51] Int. Cl. ........................................................ H03f 1/00
[50] Field of Search ............................................ 330/9, 300, 69, 100, 110, 151

[56] References Cited

UNITED STATES PATENTS

| | | | |
|---|---|---|---|
| 2,684,999 | 7/1954 | Goldberg et al. ............ | 330/9 |
| 3,268,850 | 8/1966 | Ragsdale ...................... | 330/110 |

FOREIGN PATENTS

| | | | |
|---|---|---|---|
| 971,074 | 9/1964 | Great Britain ................ | 330/9 |

OTHER REFERENCES

HANDBOOK OF OPERATIONAL AMPLIFIER APPLICATIONS, Burr-Brown Research Corp., First Edition 1963, pps. 42, 43.

HEWLETT-PACKARD JOURNAL, vol. 14, No. 3— 4, Nov.-Dec., 1962. 330-9

Koerner, " How To Extend Operational Amplifier Response", Electronics, November 11, 1960, pp. 90,91. 330-9

*Primary Examiner*—Roy Lake
*Assistant Examiner*—James B. Mullins
*Attorneys*—T. E. Bieber and J. H. McCarthy

ABSTRACT: Two operational amplifiers are connected in series. The first operational amplifier has a very stable drift characteristic and a feedback capacitor such that it has a very low frequency breakpoint. The second operational amplifier has a very fast response characteristic but may have a poor drift characteristic. A feedback impedance connects the output of a second operational amplifier to the input of the first operational amplifier and the input to the entire circuit is through an input impedance to the inverting input of both the first and second operational amplifiers.

INVENTOR:
WILLIAM C. MONTGOMERY JR.

INVENTOR:
WILLIAM C. MONTGOMERY JR.

FAST SETTLING, STABLE AMPLIFIER CIRCUIT

BACKGROUND OF THE INVENTION

It is often desirable to have a cheap amplifier that is both responsive to very high frequency signals and at the same time has a low temperature drift characteristic. The problem is that aside from extremely expensive amplifier circuits, all fast circuits have a very bad temperature drift characteristic, and all amplifiers that have a very good drift characteristic are not responsive to high frequency signals. Thus an object of this invention is to provide a cheap yet stable and fast-responding amplifier.

SUMMARY OF THE INVENTION

The problem described in the previous paragraph can be solved by a circuit incorporating two cheap amplifier means in the following manner. A first amplifier means having an inverting and noninverting input and output, and having a stable DC operating point and substantially no gain at high frequencies is provided. A second amplifier means having an inverting and noninverting input and an output, has its noninverting input connected to the output of said first amplifier means. The second amplifier means has a fast response characteristic but a poor drift characteristic. Feedback means connect the output of said amplifier means and the inverting input of said first amplifier means. And input means is connected to the inverting input of both the first and the second amplifier means.

DESCRIPTION OF THE PREFERRED EMBODIMENT

Figure 1:
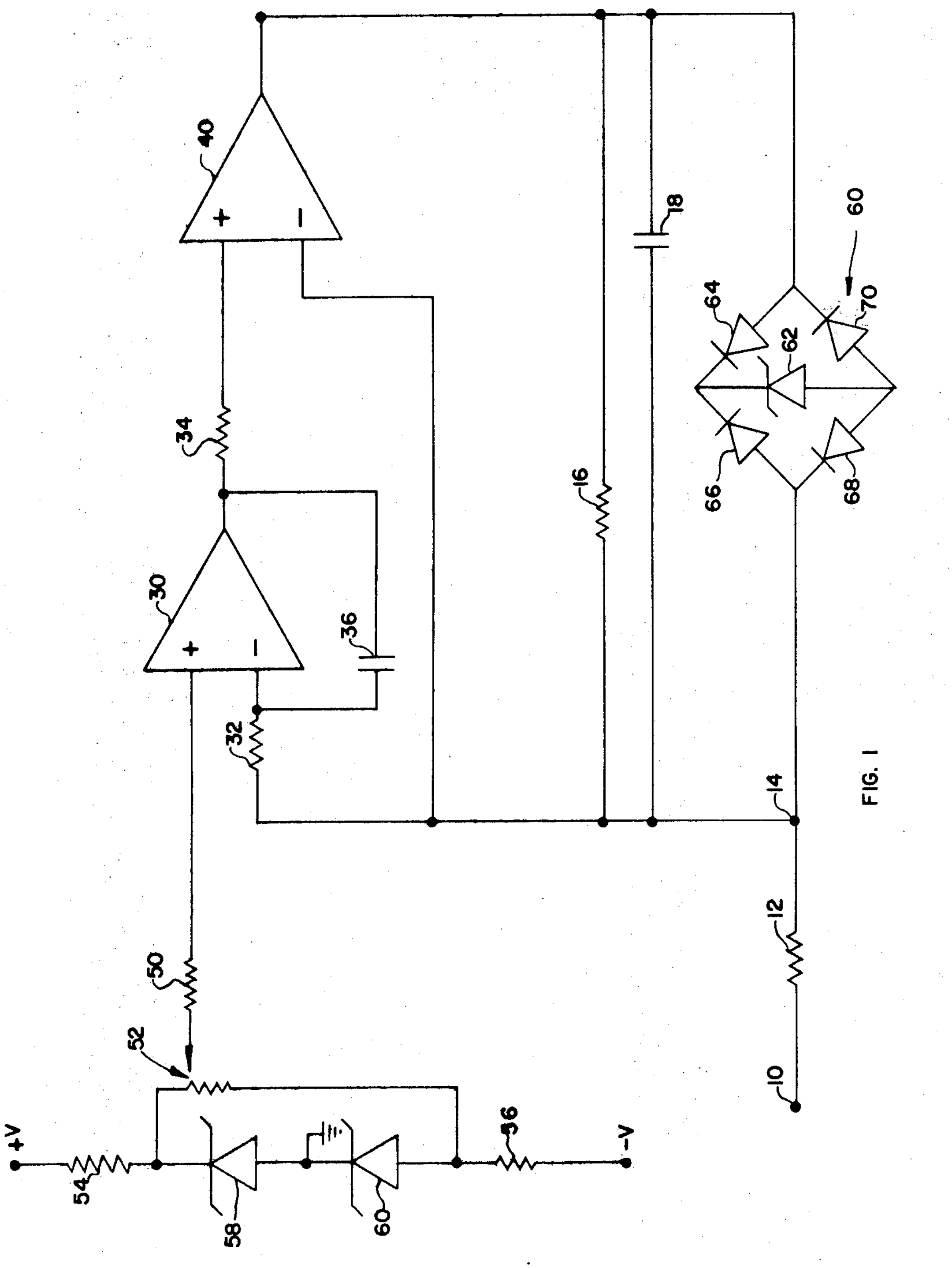
FIG. 1 is a circuit diagram of the invention.

FIG. 1 shows an amplifier circuit consisting of two operational amplifiers in cascade with a feedback network connecting the output of the circuit to the input. Operational amplifier 30 is a very low drift, low frequency device. An example of an operational amplifier that has been used successfully for this function is Analog Devices Corporation Unit No. 183C that has a drift characteristic of 2 microvolts per degree centigrade. Operational amplifier 40 may have a poor drift characteristic but should have a very fast response characteristic. For example, an operational amplifier having a 0.01 percent settling within 1 microsecond has been used successfully. An amplification of this type is described in the Jan. 1969 catalog of Analog Devices Corporation, Cambridge, Massachusetts as Unit 20 No. 120A.

The input to the circuit is indicated by reference numeral 10. Impedance 12 is the input impedance and point 14 is a virtual ground or summing point. Operational amplifiers 30 and 40 operate together as an operational amplifier with impedance 12 as the input impedance and resistor 16 and capacitor 18 operating as the feedback impedance. Point 14 is connected directly to the negative or inverting input of operational amplifier 40 and through impedance 32 to the negative input of amplifier 30. The output of amplifier 30 is connected through impedance 34 to the positive or noninverting input of amplifier 40, and is fed back to the negative or inverting input of amplifier 30 via capacitor 36. The effect of capacitor 36 is to take operational amplifier 30 out of the circuit at high frequencies. This is desirable since amplifier 30 is only of interest at DC where it controls the drift of the circuit as will be demonstrated later. For example, if capacitor 30 has a nominal value of 1 microfarad and resistor 32 is 10,000 Ω, the 3 db. break point will be 16 cycles. Thus, at signal frequencies of 50—100 kilocycles, operational amplifier 30 is well out of the circuit. However, at DC the gain of amplifier 30 is about 80 db.

The positive input of amplifier 30 is connected via impedance 50 and rheostat 52 to an offset control circuit consisting of a positive voltage supply, a negative voltage supply, resistors 54 and 56 and Zener diodes 58 and 60. Typically, the voltage supplies may be 15 volts and the Zeners may have a breakdown voltage of 5 volts. The function of the offset control portion of the circuit is to supply a very steady DC voltage to the positive input of amplifier 30.

Connected between the output of amplifier 40 and summing junction 14, in parallel with the feedback impedance, is a clipping circuit 61 comprising a Zener diode 62 and four diodes 64, 66, 68 and 70. Clipping circuit 60 operates to limit the output signal so as to avoid saturation of the amplifier. Nominally, a 9.1 volt Zener diode is used, and the four diodes are so arranged that the Zener diode will break down with either a positive signal or a negative signal. The advantage of using one Zener in the illustrated arrangement as opposed to two back-to-back Zeners is an increase in clipping level accuracy.

OPERATION OF THE CIRCUIT

To help understand the operation of the circuit, it is helpful to work through an example.

Assume that the output of amplifier 40 drifts by some small amount, say 100 microvolts, due to some change in the input to amplifier 40. The 100 microvolt offset then is applied to the input of amplifier 30 through feedback resistor 16 and resistor 32. The polarity of the output signal of amplifier 40 is such that the feedback signal will tend to force the circuit to compensate for the drift. For example, if a positive offset appears at the output of amplifier 40, it is transmitted back through feedback resistor 16 and resistor 32 to the inverting input of amplifier 30. Since amplifier 30 is a very stable amplifier, its output will not have drifted. The 100-microvolt offset will appear across the input terminals of amplifier 30 and a large negative signal equal to 100 microvolts times the open loop gain of amplifier 30 will be immediately supplied to the positive input of amplifier 40. The signal appearing at the output of amplifier 30 will be negative and when applied to the positive input of amplifier 40 will tend to drive the output of amplifier 40 in a negative direction to compensate for the positive offset due to drift. The effect of amplifier 30 is to reduce the offset of amplifier 40 by the gain of amplifier 30.

Figure 2:
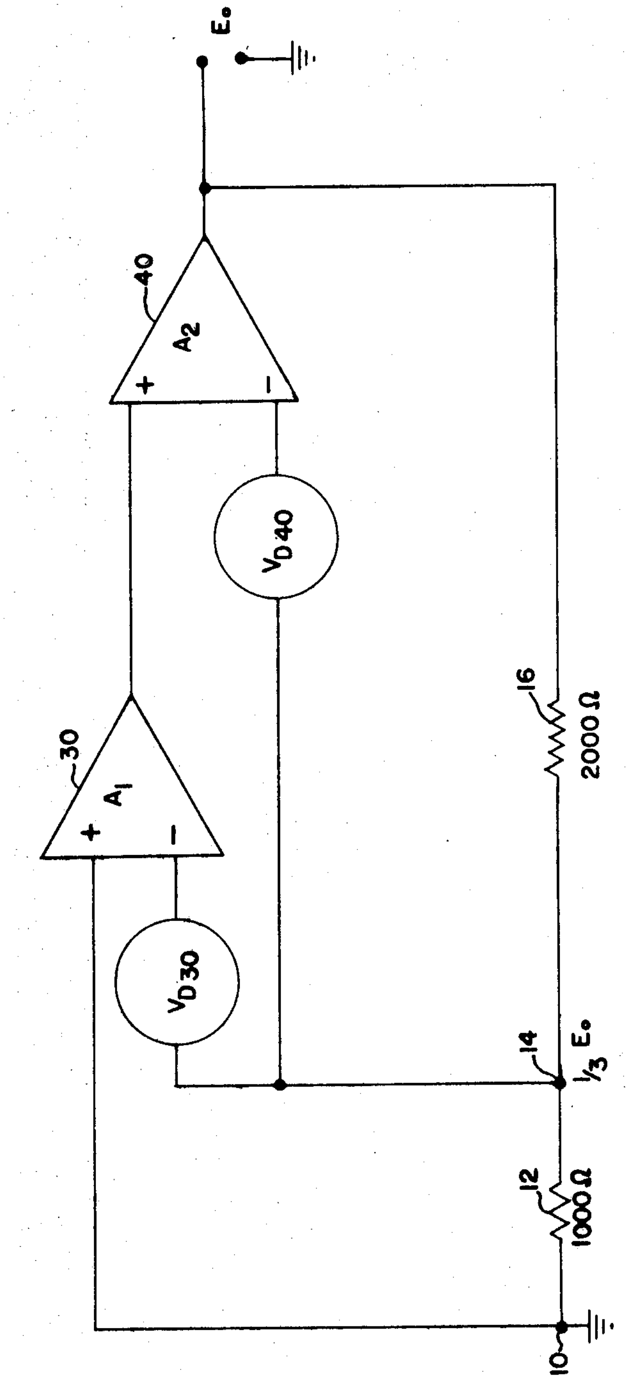
FIG. 2 is an equivalent circuit to that in FIG. 1 and shows drift voltages.

The fact that the drift of the circuit is controlled by the drift of amplifier 30 can be demonstrated mathematically. FIG. 2 shows the equivalent circuit of FIG. 1 with drift voltages $V_{30}$ and $V_{40}$ shown as voltage generators and with the circuit input 10 grounded.

The output drift of the circuit, $E_0$, given by $E_0=(E_1 \pm V_{d40})A_2$ (1)

and $E_1=1/3E_0-(1/3 \pm V_{d30})A_1$ (2)

where $A_1$ = amplifier 30 voltage gain $A_2$ = amplifier 40 voltage gain $V_{d30}$ = drift voltage of amplifier 30 and $V_{d40}$ = drift voltage of amplifier 40

Equation 2 follows from the fact that the 1,000Ω and 2,000Ω resistances act as a voltage divider, and $1/3E_0 \pm V_{d30}$ is the input 30 to amplifier 30.

Substituting equation 2 into equation 1:

$E_0=[1/3E_0 a l (E_0 \pm V_{d30})A_1 \pm V_{d40}]A_2$ (3)

Solving equation 3 for $E_0$, one gets $$E_0=\frac{\pm V_{d30}A_1A_2 \pm V_{d40}A_2}{1-\frac{1}{3}A_2+\frac{1}{3}A_1A_2} \qquad (4)$$

Since $A_1>>1$ and $A_2>>1$, the 1 in the denominator of equation 4 may be disregarded. After disregarding the 1 and rearranging, equation 4 becomes $$E_0=\frac{3(\pm V_{d30}A_1 \pm V_{d40})A_2}{(A_1-1)A_2} \qquad (5)$$

After again disregarding the 1 in the denominator equation 5 becomes $$E_0 \cong \pm 3V_{d30} \pm \frac{3V_{d40}}{A_1} \quad (6)$$

Since $A_1$ is very large, of the order of 80 db., the second term of equation 6 becomes insignificant.

Although amplifier 30 completely controls the drift characteristic of the circuit, it does not react to signals appearing at input 10. This is due in part to capacitor 36 but also to the fact that point 14 is a virtual ground and does not move very much in response to signals appearing at input 10. In practice point 14 will move no more than the input voltage divided by the open loop gain of the amplifier system. A voltage appearing at input terminal 10 will cause an input current to flow through input impedance 12; however, since point 14 is a virtual ground and there are no alternative current paths available the input current must be sinked through the feedback impedance to the output of operational amplifier 40. Thus, the response time of operational amplifier 40 completely controls the speed with which the circuit output changes in response to an input signal.

EXAMPLE

To illustrate the foregoing principles, nominal component values will be given that correspond to a circuit that has been successfully tested, and an actual numerical example will be carried through. For purposes of this example, assume that input impedance 12 is a 1,000-ohm resistor, that feedback impedance 16 is a 2,000-ohm resistor, and that feedback capacitor 18 is 10 picrofarads. Suppose now that a 5 -volt input is supplied to input terminal 10. Then 5 milliamperes will flow through resistor 16. Thus, the output of amplifier 40 must go down 10 volts to sink the 5 milliamps of current passing through the 2K resistor.

I claim:

1. A fast settling, stable amplifier circuit, comprising:
   a first operational amplifier having a positive input terminal, a negative input terminal and an output terminal, said amplifier having a very stable drift characteristic;
   a first capacitor connected between said output terminal and said negative input terminal of said first operational amplifier;
   offset control means connected to said positive input terminal of said first operational amplifier and adapted to supply a steady supply of power thereto;
   a second operational amplifier having a positive input terminal, a negative input terminal and an output terminal, said positive input terminal being operatively connected to the output terminal of said first operational amplifier, said second operational amplifier having a fast response characteristic;
   a feedback impedance connected between the output terminal of said second operational amplifier and a negative input terminal of said first operational amplifier;
   an input impedance connected to the negative input terminal of said first operational amplifier and the negative input terminal of said second operational amplifier.

2. The circuit of claim 2 wherein said first capacitor means has a value such that the gain of said first operational amplifier has a break frequency of approximately 16 cycles.

3. The circuit of claim 1 further characterized by a clipping circuit connected between the negative input terminal of said first operational amplifier and the output terminal of said second operational amplifier whereby overloading of said amplifier circuit is avoided.

4. The circuit of claim 1 wherein said feedback impedance comprises a resistor and second capacitor in parallel; and said input impedance comprises a resistor.

5. The circuit of claim 4 wherein said first operational amplifier has a drift of not more than 2 microvolts per degree C.; and said second amplifier settles to within 0.01 percent of its final value in 1 microsecond.